United States Patent [19]
Sahai et al.

[11] Patent Number: 5,698,971
[45] Date of Patent: Dec. 16, 1997

[54] DEVICE FOR DETECTING THE END OF BATTERY LIFE, POWER SUPPLY CIRCUIT HAVING THE DEVICE, AND A PORTABLE MACHINE HAVING THE POWER SUPPLY CIRCUIT

[75] Inventors: Hitoshi Sahai; Yosiaki Suenaga; Hiroyuki Maeda, all of Ukyo-ku, Japan

[73] Assignee: Rohm Co., Ltd., Kyoto, Japan

[21] Appl. No.: 654,667

[22] Filed: May 29, 1996

[30] Foreign Application Priority Data

Jun. 1, 1995 [JP] Japan .................................. 7-158606

[51] Int. Cl.$^6$ ............................................. G05F 1/40
[52] U.S. Cl. ............................................. 323/282; 320/48
[58] Field of Search .......................... 323/282; 320/48, 320/39; 324/433

[56] References Cited

U.S. PATENT DOCUMENTS 4,716,354  12/1987  Hacker ................................. 320/39
5,136,246  8/1992  Sakamoto ............................. 324/433

*Primary Examiner*—Peter S. Wong
*Assistant Examiner*—Rajnikant B. Patel
*Attorney, Agent, or Firm*—Fay, Sharpe, Beall, Fagan, Minnich & McKee

[57] ABSTRACT

The improved device for detecting the end of battery life due to the depletion of battery power has a constant-voltage generator circuit that delivers a constant voltage until the voltage for use limit is reached. An A/D converter circuit performs A/D conversion on the constant voltage from the constant-voltage generator circuit in response to the operating power from a power supply line which decreases as the battery depletes. The device detects the end of battery life in response to the A/D converted value from the A/D converter circuit when the value of digital data obtained by conversion of the constant voltage has varied to exceed a specified level.

13 Claims, 4 Drawing Sheets

DEVICE FOR DETECTING THE END OF BATTERY LIFE, POWER SUPPLY CIRCUIT HAVING THE DEVICE, AND A PORTABLE MACHINE HAVING THE POWER SUPPLY CIRCUIT

TECHNICAL FIELD

This invention relates to a device for detecting the end of battery life, a power supply circuit having such a device, and a portable machine having such a power supply circuit. More specifically, the invention relates to a device for detecting the end of battery life that is suitable for use with power supply circuits for portable acoustic machines such as portable magnetic tape players and portable CD players that operate on one or more dry cells and with battery-driven portable machines such as cameras and which allows the batteries to be used to the very end of their useful life.

BACKGROUND ART

Conventional portable magnetic tape players such as headphone stereosonic players, DCCs and DATs, as well as portable disk players such as MDs and CDs operate on one or two dry cells. Therefore, the audio circuits incorporated in these devices have a line voltage of about only 1.2 or 2.4 volts. In compact cameras or the like, metering and autofocusing devices, as well as motors that drive them, operate on the power of batteries.

These battery-driven devices usually have a microcontroller, a liquid-crystal display device (LCD), etc. as built-in components. If, as the result of voltage detection, the power of a battery is found to be lower than a specified value, a message is delivered to the effect that the battery need be replaced or that its useful life is close to the end or that it has come to an end and the message is displayed on the LCD. If the useful life of the battery has come to an end, the supply of power is cut off.

The term "the end of battery life" as used herein means such a situation that since the line voltage of a battery-driven machine has dropped below a specified level, the power supply is turned off to shut down the machine, thereby permitting the "dead" battery to be replaced by a new one that enables continued use of the machine.

FIG. 5 is a block diagram showing a power supply circuit having a device of the type contemplated by the invention for detecting the end of battery life. Indicated by numeral 1 is the battery and the power from the battery 1 flows through a primary input line 2 to be sent into a three-terminal regulator 3 (hereunder referred to simply as "regulator 3"), where it is controlled to have a constant voltage for flowing through a secondary output line 4 (Vcc). The line 4 usually has two loads connected thereto; one is a control circuit 5 which is generally referred to as a microcontroller and the other is a signal processing circuit 6 such as an audio signal amplifying circuit. A voltage divider circuit comprising resistors $R_1$ and $R_2$ is provided as a voltage detector circuit 7 between the power input line 2 and the ground GND for detecting the voltage of the battery 1. A divided voltage detected with the detector circuit 7 is fed into the control circuit 5. Shown by numeral 8 is an LCD (liquid-crystal display device) for signalling a message that indicates the end of battery life or the operating state of the machine.

Since the output of the regulator 3 is usually constant, the control circuit 5 references this output (or its divided voltage) and performs A/D conversion on the input detected voltage by means of an A/D converter circuit (A/D) 5a of a voltage comparison type which comprises a plurality of parallel-connected reference voltage comparing circuits. A/D 5a may generate a 4-bit digital value twice so that the detected voltage is converted to an 8-bit digital value, which is received by the control circuit 5 and compared with the specified reference value in order to check whether the battery needs to be replaced by a new one or whether it is close to the end of its useful life and if the answer is affirmative, the relevant message is signaled to the LCD 8. If the battery is found to be "dead", the necessary action is taken (i.e., the message for "the end of battery life" is displayed and the supply of power is cut off).

In the system shown in FIG. 5, the voltage detector circuit 7 is connected in parallel with to the battery 1. Because of this circuit configuration, current flows all the time so as to consume the power of the battery. Therefore, it is common practice in the art to reduce power consumption by inserting a switching circuit or any other necessary circuit in series with the voltage detector circuit 7 such that it is controlled to be operative at periodic intervals; however, such a control circuit is not shown in FIG. 5.

FIG. 6 shows graphically the relationship between the total output voltage of two cells and the time from the signalling of a warning message to the effect that the battery need be replaced or that it is close to the end of its useful life to the actual signalling of "the end of battery life" or the disconnection of power. The time at which the "end of battery life" is signalled or the power supply is turned off is normally set at limiting point L where the output of the regulator 3 maintains a reference constant level. Curve A in FIG. 6 represents the voltage of the battery; curve B represents the output voltage of the regulator 3; curve C represents the voltage detected via A/D 5a. Voltage level $V_1$ tagged "AL" (for alarm) corresponds to the aforementioned reference value, indicating the time to start the signalling of a warning message to the effect that the battery need be replaced or that it is close the end of its useful life. The voltage at point E is the reference voltage level $V_2$ for taking the necessary action when the battery life has come to an end.

As FIG. 6 shows, the end of the time period T of warning to the effect that the battery need be replaced or that it is close to the end of its useful life, namely, the point E at which the power supply is turned off to shut down the machine is set at or just before the limiting point L beyond which the output voltage of the regulator 3 is no longer constant. The reason is that if the output voltage drops below a constant level, the reference value for A/D conversion changes and the A/D converted value is no longer reliable. Beyond point E, the control circuit 5 usually takes the necessary action to shut down the machine.

However, the useful life of the battery is longer than what is indicated by point E. The above-described device for detecting the "end of battery life" uses the output of the regulator 3 as a reference voltage for A/D conversion, so voltage detection is performed with said output being held constant. Therefore, no point of detection can be set on the limiting side of battery use. As a consequence, with the device for detecting the end of battery life which is of the type contemplated by the invention, a warning to the effect that the battery needs to be replaced or that it is close to the end of its useful life will be issued considerably before the battery life ends in the true sense of the term. Since actual battery replacement is based on this warning, there is a certain waste of energy compared to the case where battery replacement is effected only after the battery life has ended in the true sense of the term.

SUMMARY OF THE INVENTION

The present invention has been accomplished under these circumstances and has as an object providing a device that can detect the end of battery life such that batteries can be used to the very end of their useful life.

Another object of the invention is to provide a power supply circuit that can tap the power of batteries until the very end of their useful life.

Another object of the invention is to provide a portable machine that can be operated on a battery such that the battery power can be tapped until the very end of its useful life.

The first object of the invention can be attained by a device for detecting the end of battery life due to the depletion of battery power, which comprises a constant-voltage generator circuit that delivers a constant voltage until the voltage for use limit is reached and an A/D converter circuit that performs A/D conversion on the constant voltage from said constant-voltage generator circuit in response to the operating power from a power supply line which decreases as the battery depletes, said device detecting the end of battery life in response to the A/D converted value from said A/D converter circuit when the value of digital data obtained by conversion of said constant voltage has varied to exceed a specified level.

Stated more specifically, the device has an A/D which receives a specified constant voltage as an input signal until the use limit of an operating battery is reached, which receives the output voltage of said regulator circuit as a reference voltage (i.e., one for determining the voltage per LSB within the A/D, such as the voltage of the power supply within the A/D) and which generates a converted value in accordance with said reference voltage (line voltage) and said input signal, and means for detecting the end of battery life which has as a reference said converted value obtained in accordance with the voltage of said regulator circuit for the case where the device is still within an operational range and where the voltage of said battery has dropped near to its use limit, and which senses the end of battery life when said converted value has exceeded said reference.

Thus, the voltage which determines the voltage per LSB within the A/D, such as the power supply within the A/D (reference voltage) which may be of a voltage comparison type that performs voltage comparison with the input signal is supplied from the output of the regulator circuit and the reference voltage (from the internal power supply) is rendered variable whereas the voltage as the input signal is fixed such as to yield an A/D converted value in accordance with the variation in the reference voltage (the voltage of the power supply within the A/D).

If the A/D is of a voltage comparison type having a plurality of voltage comparator circuits, each comparator circuit receives an analog input signal and, in accordance with its own reference of comparison, binarizes the analog signal to either "0" or "1" thereby generating a 1-bit converted value. If the reference voltage for comparison (the voltage of the internal power supply) drops, the level of a certain 1-bit converted value may accordingly shift from "0" to "1" depending upon the relationship with the voltage of the input signal. As a result, the A/D converted value will increase in response to the drop in the reference voltage for comparison at each comparator circuit, namely, the drop in the voltage of the internal power supply.

Therefore, if a varying voltage is added to the reference voltage for the A/D, one can obtain as the A/D converted value the point of time to start warning to the effect that the battery needs to be replaced or that it is close to the end of its useful life and this allows for detection of the warning time. If the output of the regulator has dropped to a level close to the use limit of the battery, the associated A/D converted value can be obtained as a detection value, which allows for the detection of the end of battery life.

As a consequence, the end of battery life can be detected such that the point of time either for cutting off the power supply to the machine or displaying a message for the end of battery life is extended nearer to the end of the useful life of the battery than has been possible in the prior art, thereby enabling the battery to be used to the very end of its useful life. If the machine is a portable CD, the play time between battery changes can be prolonged and the frequency of battery replacements is sufficiently reduced to achieve effective use of batteries.

DESCRIPTION OF THE PREFERRED EMBODIMENTS

Figure 1:
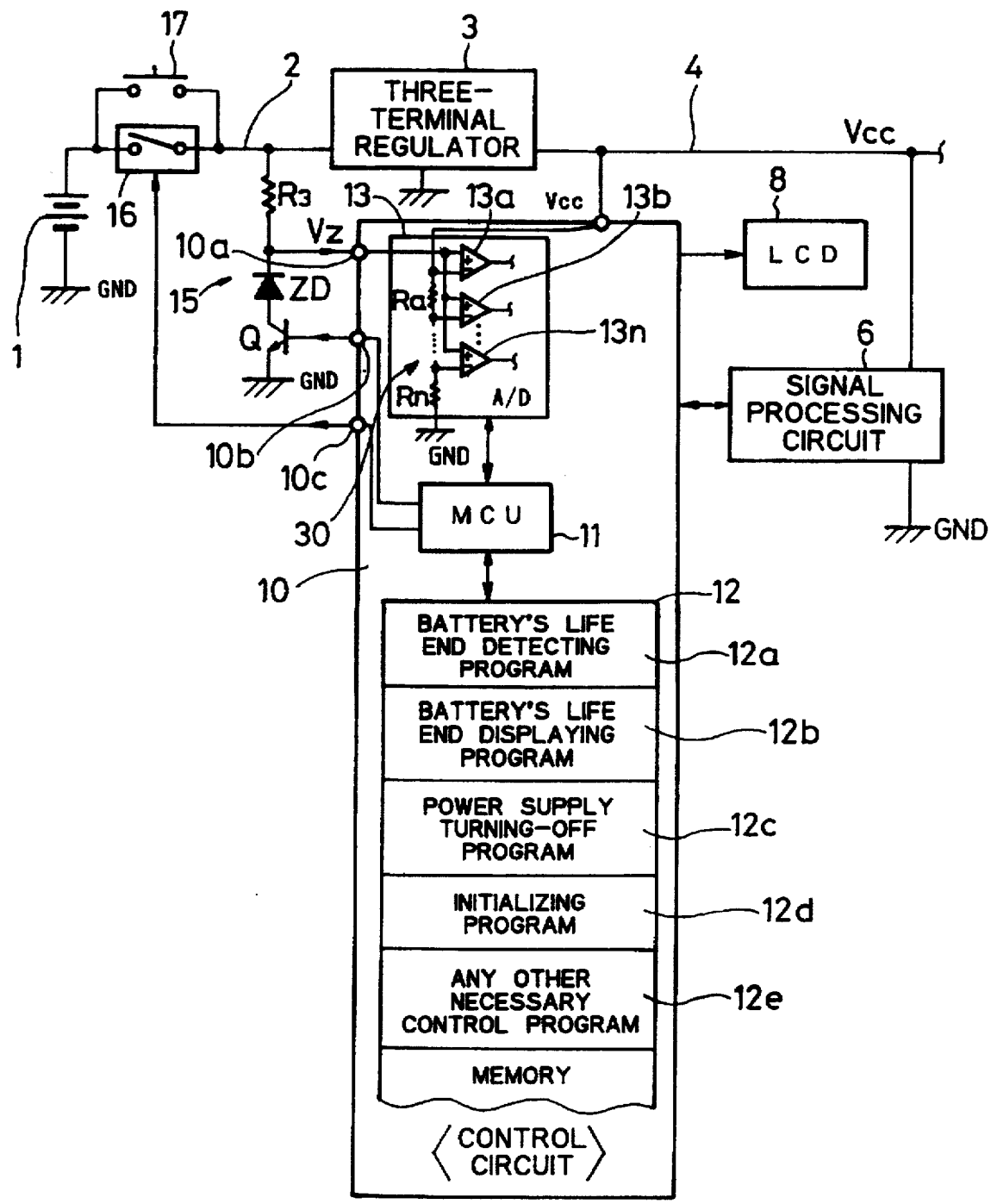
FIG. 1 is a circuit diagram for a power supply circuit incorporating a device for detecting the end of battery life according to an embodiment of the invention.
Figure 5:
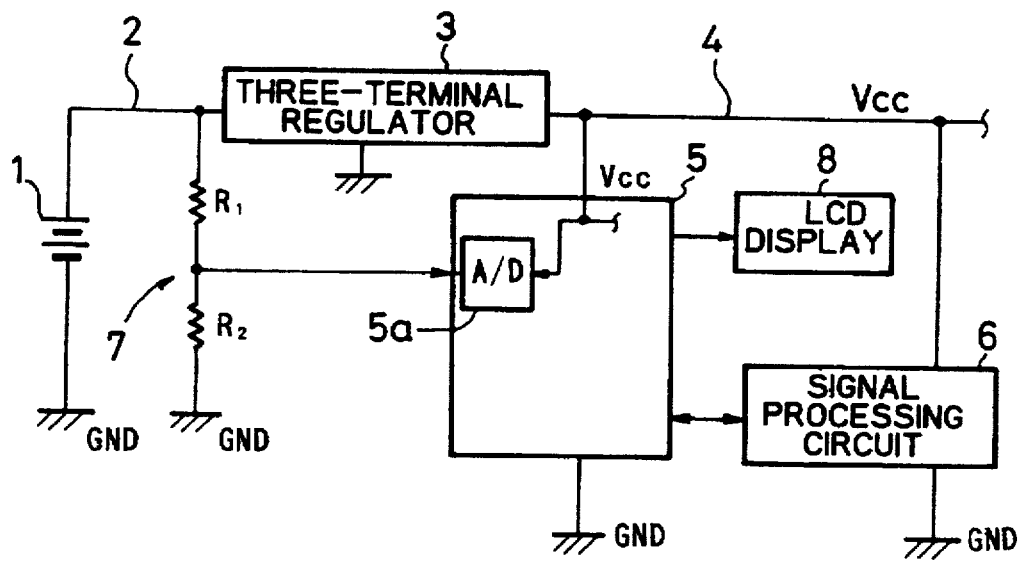
FIG. 5 is a block diagram for a power supply circuit incorporating a prior art device for detecting the end of battery life.

The basic structural difference between the device shown in FIG. 1 which detects the end of battery life according to the invention and the conventional device shown in FIG. 5 is that in the invention device, even after the regulator 3 becomes no longer capable of regulation with a constant voltage supplied to the input terminal of the A/D, A/D converted values are drawn in response to the variations in the reference voltage for the A/D (the voltage of the internal power supply), namely, in response to the variations in the voltage at the output terminal (secondary output) of the regulator, whereby the variations in the output voltage of the regulator are picked up as A/D converted values. This ensures that the depletion of cells can be sensed as A/D converted values until after the voltage they deliver has dropped to a level very close to the use limit.

In the following description of the invention device, those parts which are the same as shown in FIG. 5 are identified by like numerals and will not be described in detail.

Shown by 10 is a control circuit typically composed of a one-chip microcomputer, which incorporates a memory 12 chiefly composed of MCU 11 and a ROM, as well as an A/D converter (A/D) 13. Like A/D 5a shown in FIG. 5, A/D 13 is of a voltage comparison type and comprises a plurality of parallel-connected reference voltage comparator circuits 13a, 13b, . . . , 13n. The respective reference voltage input terminals of the comparator circuits 13a, 13b, ..., 13n are supplied with voltage levels obtained by division in a resistance voltage divider circuit 130. It should be noted that the comparison input terminal of circuit 13a is directly supplied with the voltage on the secondary output line 4 (Vcc) of the regulator 3.

The resistance voltage divider circuit 130 is a series circuit of resistors Ra, ..., Rn and inserted between the secondary output line 4 (delivering voltage Vcc) of the regulator 3 and the ground GND. The voltage Vcc on the secondary output line 4 is divided by the respective resistors with respect to the ground GND. As ar result, the comparator circuit 13a receives Vcc as the reference input voltage and subsequent comparator circuits 13b, ..., 13n receive as their reference inputs the voltages obtained through division by the associated resistances.

Each of the comparator circuits 13a, 13b, ..., 13n receives a constant voltage Vz at one of the input terminals and compares it with the reference voltage for comparison (i.e., the divided voltage as generated through division of the reference Vcc by respective resistor Ra, ... or Rn), thereby generating a signal for "0" or "1". The memory 12 contains a battery's life end detecting program 12a, a battery's life end displaying program 12b, a power supply turning-off program 12c, an initializing program 12d and any other necessary control program 12e.

Shown by 15 is a constant-voltage generating circuit which is inserted between a power input line 2 (i.e., the output of battery 1) and the ground GND. The constant-voltage generator circuit 15 is a series circuit of resistor $R_3$, a zener diode ZD and a transistor Q which works as a switching circuit. The output terminal of zener diode ZD is connected to the input terminal 10a of a control circuit 10, which is supplied with a constant voltage Vz at said input terminal.

The base of transistor Q is connected to the output terminal 10b of the control circuit 10 such that it receives a control signal at that terminal. The control signal is sent to the terminal 10b of the control circuit 10 from MCU 11 either directly or via a buffer amp (not shown). When transistor Q turns on in response to this control signal, constant voltage Vs is generated at the output terminal of zener diode ZD and supplied as an input signal into A/D 13 via input terminal 10a. A/D 13 supplies Vcc (the output voltage of regulator 13) as the reference voltage for comparison by each of the comparator circuits 13a, 13b, ..., 13n, whereupon an A/D converted value is produced that corresponds to the input signal which represents a constant voltage.

In the device of the invention, the input signal to be A/D converted has a fixed voltage, so different values of A/D conversion of the input signal are obtained only when the reference voltage varies, whereby the variation in the output voltage from the voltage controlling regulator 3 is detected.

Stated more specifically, reference voltage comparator circuits 13a, 13b, ..., 13n are supplied with analog input signals in accordance with their respective reference values for comparison; the circuits binarize such input signals to either "0" or "1", thereby generating 1-bit converted values. When the output voltage of the regulator 3 drops to produce smaller reference values for comparison by the respective comparator circuits, some of the 1-bit converted values will accordingly shift from "0" to "1" depending upon the relationship between the input signal and the voltage to be compared with. As a result, the A/D converted values will increase in accordance with the drop in the reference voltage for comparison, namely, in accordance with the drop in the voltage of the power supply within the A/D.

Figure 3:
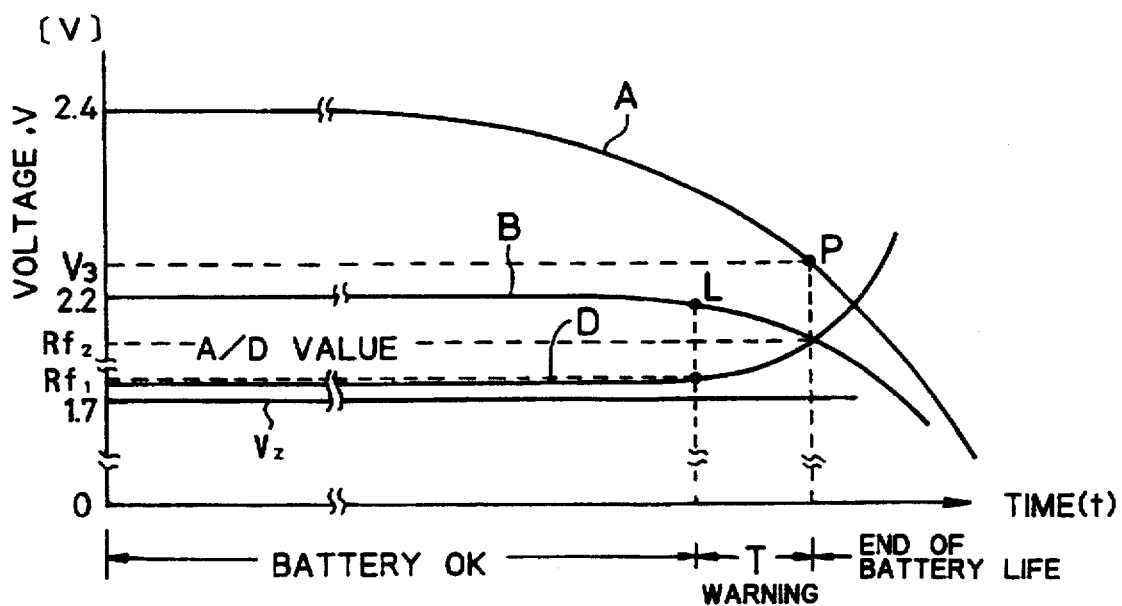
FIG. 3 is a graph showing the changes in the total output voltage of two cells that occur within the period of time from the signalling of a warning message to the effect that the battery needs to be replaced until the signalling of the end of battery life or the disconnection of power.
Figure 6:
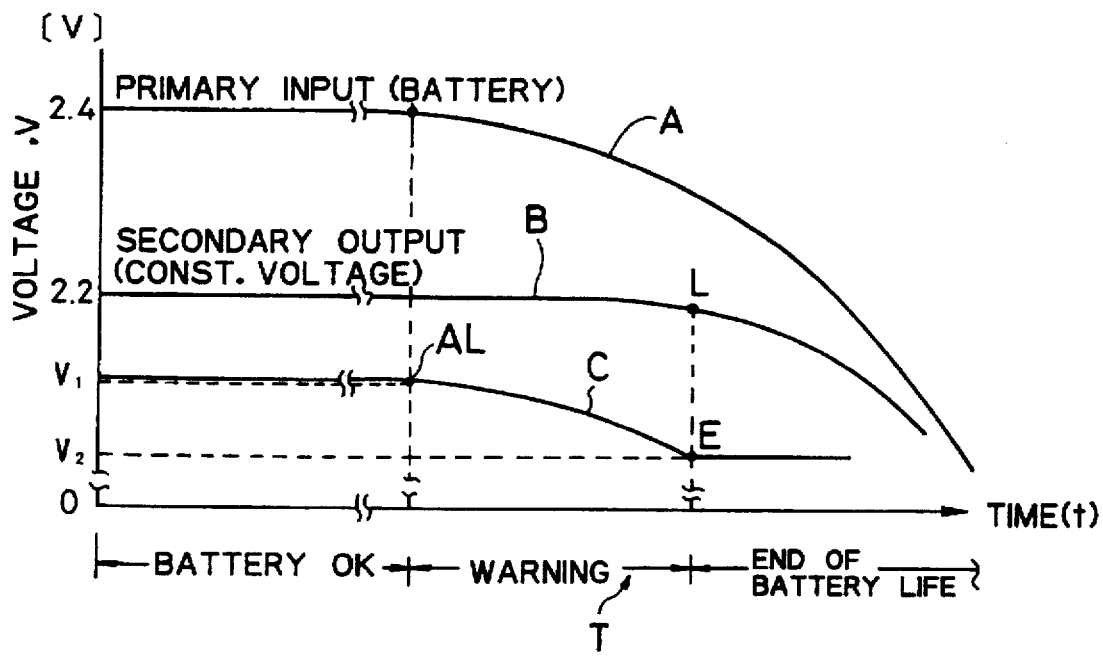
FIG. 6 is a graph showing the changes in the total output voltage of two cells that occur in a prior art power supply circuit within the period of time from the signalling of a warning message to the effect that the battery need be replaced until the signalling of the end of battery life or the disconnection of power.

Thus, the conversion data of digital values that have bene obtained by A/D conversion in accordance with the fixed voltage Vz and the voltage Vcc represent the drop in the voltage of the battery. The relationship between the output voltage of the battery and the values of A/D conversion is shown in FIG. 3 for the case where the battery consists of two cells. Even after the voltage of battery 1 represented by curve A decreases below a level near the constant output voltage of regulator 3 (at point L which corresponds to point L in FIG. 6 which indicates the end of battery life), values of A/D conversion (curve D) of constant voltage Vz (which is equal to 1.7 V in FIG. 3) can be obtained with the A/D of a simple reference voltage comparison type until the battery voltage decreases to a level $V_3$ at point P which is close to the use limit of battery 1 and which yet is within the range where the machine of interest is operational on the output of battery 1 or regulator 3.

It should be noted here that point P on curve A in FIG. 3 corresponds to $Rf_2$ at which curves B and D cross each other and which represents the reference level for curve D plotting the values of A/D conversion. Since this point P is in substantial agreement with a point that is close to the use limit of battery 1 and which yet is within the range where the circuits in the machine of interest are operational, the embodiment illustrated in FIG. 3 detects the end of battery life when any value of A/D conversion has exceeded the reference level $Rf_2$.

Turning back to FIG. 1, reference 16 designates a power switch circuit that is inserted between battery 1 and regulator 3 and which is typically composed of an analog switch. The control terminal of the power switch circuit 16 is connected to the output terminal 10c of the control circuit 10 such that it receives a control signal at said output terminal. Like the control signal received by transistor Q, the control signal received by the power switch circuit 16 is sent to terminal 10c of the control circuit 10 from MCU 11 either directly or via a buffer amp (not shown).

Shown by 17 is a start-up switch which turns on only while an operating switch is on.

Control circuit 10 first activates the initializing program 12d when it is supplied with the line voltage Vcc after the start-up switch 17 turns on. When this program is executed, MCU 11 generates a control signal of high level (H) at terminal 10c to turn on the power switch circuit 16. MCU 11 also sends out an initializing control signal to each of the circuits within the machine of interest so that they are supplied with a constant-voltage power that is generated from the regulator 3.

Figure 2:
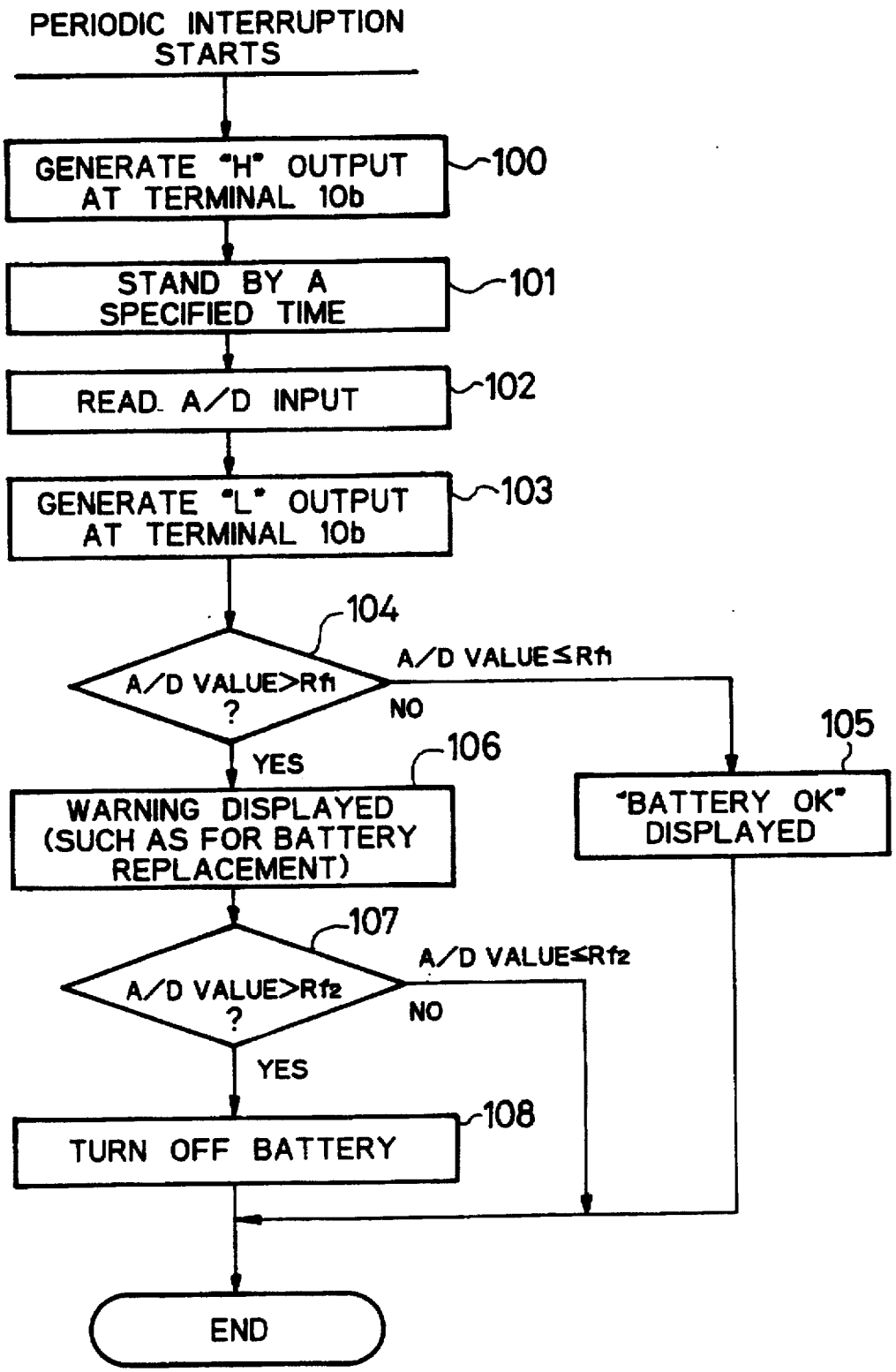
FIG. 2 is a flowchart for the process of detecting the end of battery life.

The battery's life end detecting program 12a is a periodic interrupting program that has the A/D converted values $Rf_1$ and $Rf_2$ (see FIG. 3) as reference data for comparison and, as shown in FIG. 2, this program is executed by MCU 11 for each lapse of a specified time (e.g. 16 msec). When this program is executed, MCU 11 generates a "H" control signal at terminal 10b (see step 100 in FIG. 2), whereupon transistor Q turns on. After stand-by for a specified time (step 101), the data obtained by A/D conversion with A/D 13 are read out of A/D 13 into MCU 11 (step 102). Therefore, MCU 11 reduces the voltage at terminal 10b to a low level (L) (step 103) and determines whether the A/D converted value is above the reference level $Rf_1$ (step 104). If the result is negative, MCU 11 supplies LCD 8 with a message for displaying BATTERY OK (step 105), which ends the process.

If the result of step 104 is positive, MCU 11 supplies LCD 8 with a warning message to the effect that the battery needs to be replaced or that it is close to the end of its useful life (step 106). MCU 11 then determines whether the A/D converted value is above the reference level $Rf_2$ (step 107). If the result is negative, the process ends. On the other hand, if the result is positive, the same step (i.e., step 107) is repeated several times at specified intervals to check the decreasing line voltage over time and if the same result is obtained longer than a specified period, MCU 11 regards it as the indication of the end of battery life and renders the level of the control signal at 10c to be low (L) such that the supply of power from battery 1 is cut off (step 108). It should be noted that the step of cutting off the battery power is optional if the line voltage rises such that the A/D converted value is not higher than $Rf_2$.

As already mentioned, the value of reference $Rf_2$ for the criterion in step 107 is equal to the voltage value on curve D of FIG. 3 which is in the position corresponding to point P on curve A. Therefore, the power of battery 1 can effectively be used up to the point of time corresponding to P. As long as the voltage of battery 1 is normal, the values of A/D conversion are held constant since the two voltage values to be compared within the A/D are constant. If the output of regulator 3 starts to decrease from the constant voltage level, the reference voltage will accordingly decrease but the input voltage remains constant, thereby causing the A/D converted value to increase (see curve D in FIG. 3). The voltage at this initial point of increase is represented by the reference $Rf_1$ for checking in step 104 of the process shown in FIG. 2.

In the present invention, the warning to the effect that the battery need be replaced or that it is close to the end of its useful life is started at the point of time when the A/D converted value has exceeded the reference $Rf_1$. This start point coincides with or is very close to the point of time when the end of battery life is displayed or the power supply is cut off in the conventional device. The detection of the battery voltage in terms of A/D converted values is performed on the output of regulator 3 and continued up to point P which is very close to the use limit of battery 1. It should be remembered that point P is still within the range where the machine of interest is operational. The aforementioned reference $Rf_2$ represents the voltage at the end of curve D which slopes upwardly to approach point P infinitely.

Even if the values of A/D conversion with A/D 13 are obtained until the voltage of battery 1 drops near to point P, their reliability will not be affected since the voltage from zener diode ZD is held at a constant value. In the embodiment under consideration, the reference voltage for A/D conversion is obtained from the secondary output of regulator 3, so it is the voltage applied to the signal processing circuit 6 and the control circuit 10 that is detected in the invention and this ensures that the intended voltage detection can be performed up to the operational limits of these circuits.

Figure 4:
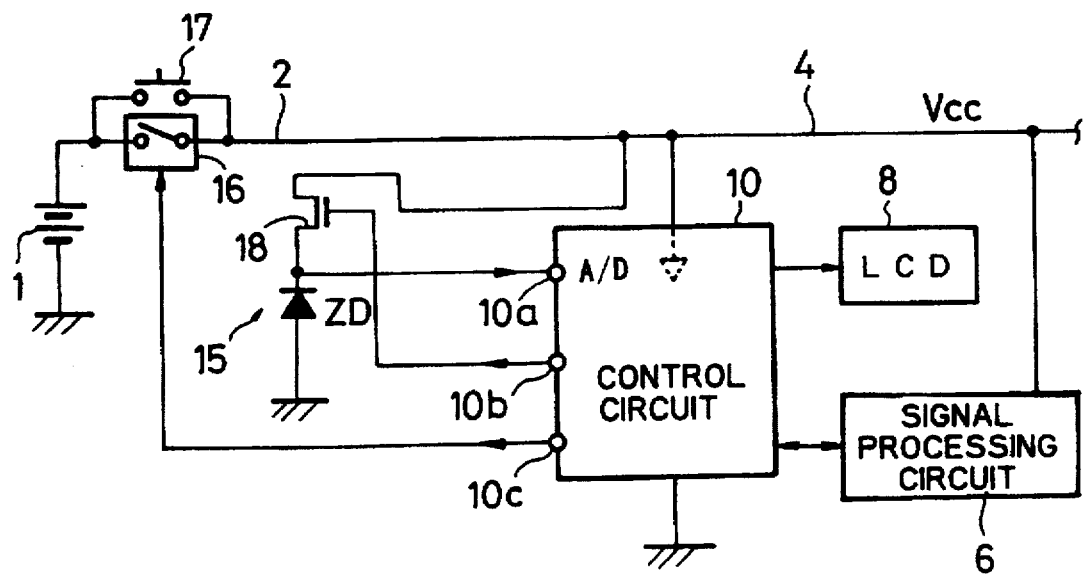
FIG. 4 is a circuit diagram for a device to detect the end of battery life according to another embodiment of the invention.

FIG. 4 shows another embodiment of the detection device of the invention, in which regulator 3 is eliminated and constant-voltage generator circuit 15 is inserted between the output of power input line 2 and the ground GND, with resistor $R_3$ and transistor Q in the constant-voltage generator circuit 15 being replaced by a single MOS FET 18. The resistance that develops when MOS FET 18 is turned on corresponds to the value of resistor $R_3$ in FIG. 1. The operation of this modified constant-voltage generator circuit 15 is the same as in the embodiment shown in FIG. 1.

Since a MOS FET serves as a resistor when it is turned on, resistor $R_3$ used in the embodiment shown in FIG. 1 may also be replaced by a MOS FET in which the gate is diode-connected to the source or drain.

While the invention has been described on the foregoing pages, it should be noted that A/D 13 is just one example of the A/D converter circuit that can be used in the invention and that various other types may be substituted, such as a sequential comparison type, an integration type, a chopper type and a simple voltage comparator circuit.

The constant-voltage generator circuit to be used in the invention may be of any type that is capable of generating the reference voltage until the voltage of a battery drops to a level at which the battery can be regarded as "dead". Therefore, any circuit that can generate the reference voltage in response to variations in the output of the regulator may be connected to the output of the regulator.

It should also be noted that an MCU is not the sole example of the processor that can be used in the control circuit 10 and that various other controllers may be used, including an MPU and a CPU. Alternatively, the processor may consist of a gate array. The constant-voltage generator circuit is in no way limited to the examples shown in FIGS. 1 and 4 and the transistor Q and MOS FET 18 each of which serves as a switch may be omitted although a greater amount of electric current will be consumed.

The cells to be detected for the end of their useful life by the device of the invention are so-called "dry cells" including alkaline cells, manganese cells and lithium-ion secondary cells.

What is claimed is:

1. A device for detecting the end of the useful life of a cell which, when mounted as a power supply to a portable machine, discharges to deliver a decreasing amount of voltage until the voltage for use limit is reached, the device comprising:

an A/D converter circuit which operates on a line voltage that varies in accordance with the voltage of said cell;

a constant-voltage generator circuit that is connected to the input of said A/D converter circuit and which delivers a constant voltage until said voltage for use limit is reached; and a control circuit that controls the operation of said A/D converter circuit and said portable machine, wherein the decreasing line voltage causes the voltage of said A/D converter circuit to decrease per least significant bit (LSB), which in turn causes a relative increase in the value of digital data obtained by A/D conversion of said constant voltage and wherein the cell is disconnected from said portable machine if the voltage for use limit is reached when said value of digital data has exceeded a specified digital value preset in said control circuit.

2. A device according to claim 1, wherein said constant-voltage generator circuit has a zener diode.

3. A device according to claim 1, wherein said control circuit is composed of a one-chip microcomputer and executes programs to control the operation of said A/D converter circuit and said portable machine.

4. A device according to claim 1, wherein said cell is either a manganese cell, an alkaline cell or a lithium-ion secondary cell.

5. A device according to claim 1, wherein said specified digital value is more than one in number and the greatest of such specified digital values is a threshold of said voltage for use limit.

6. A device according to claim 1, which further includes a regulator which regulates the power from said cell to deliver an output voltage which, in turn, is delivered as said line voltage or the output voltage of said regulator.

7. A device according to claim 1, wherein the cell is disconnected from said portable machine by turning off a switch circuit provided between said cell and said regulator.

8. A device for detecting the end of battery life due to the depletion of battery power, which comprises:

a constant-voltage generator circuit that delivers a constant voltage until the voltage for use limit is reached and an A/D converter circuit that performs A/D conversion on the constant voltage from said constant-voltage generator circuit in response to the operating power from a power supply line which decreases as said battery depletes, said device detecting the end of battery life in response to the A/D converted value from said A/D converter circuit when the value of digital data obtained by conversion of said constant voltage has varied to exceed a specified level.

9. A device for detecting the end of the useful life of a cell which, when mounted as a power supply to a portable machine, discharges to deliver a decreasing amount of voltage until the voltage for use limit is reached, the device comprising:

an A/D converter circuit which operates on a line voltage that varies in accordance with the voltage of said cell;

a constant-voltage generator circuit that is connected to the input of said A/D converter circuit and which delivers a constant voltage until said voltage for use limit is reached; and a control circuit that controls the operation of said A/D converter circuit and said portable machine, wherein the decreasing line voltage causes the voltage of said A/D converter circuit to decrease per least significant bit (LSB), which in turn causes a relative increase in the value of digital data obtained by A/D conversion of said constant voltage and wherein said device detects the end of battery life if the voltage for use limit is reached when said value of digital data has exceeded a specified digital value preset in said control circuit.

10. In a power supply circuit having a device for detecting the end of the useful life of a cell which, when mounted as a power supply to a portable machine, discharges to deliver a decreasing amount of voltage until the voltage for use limit is reached, the power supply circuit comprising:

an A/D converter circuit which operates on a line voltage that varies in accordance with the voltage of said cell;

a constant-voltage generator circuit that is connected to the input of said A/D converter circuit and which delivers a constant voltage until said voltage for use limit is reached; and a control circuit that controls the operation of said A/D converter circuit and said portable machine, wherein the decreasing line voltage causes the voltage of said A/D converter circuit to decrease per least significant bit (LSB), which in turn causes a relative increase in the value of digital data obtained by A/D conversion of said constant voltage and wherein the cell is disconnected from said portable machine if the voltage for use limit is reached when said value of digital data has exceeded a specified digital value preset in said control circuit.

11. A power supply circuit according to claim 8, wherein said constant-voltage generator circuit has a zener diode and wherein said control circuit is composed of a one-chip microcomputer and executes programs to control the operation of said A/D converter circuit and said portable machine.

12. In a portable machine having a device for detecting the end of the useful life of a cell which, when mounted as a power supply to a portable machine, discharges to deliver a decreasing amount of voltage until the voltage for use limit is reached, the portable machine comprising:

an A/D converter circuit which operates on a line voltage that varies in accordance with the voltage of said cell;

a constant-voltage generator circuit that is connected to the input of said A/D converter circuit and which delivers a constant voltage until said voltage for use limit is reached; and a control circuit that controls the operation of said A/D converter circuit and said portable machine, wherein the decreasing line voltage causes the voltage of said A/D converter circuit to decrease per least significant bit (LSB), which in turn causes a relative increase in the value of digital data obtained by A/D conversion of said constant voltage and wherein the cell is disconnected from said portable machine if the voltage for use limit is reached when said value of digital data has exceeded a specified digital value preset in said control circuit.

13. A portable machine according to claim 12, wherein said constant-voltage generator circuit has a zener diode and wherein said control circuit is composed of a one-chip microcomputer and executes programs to control the operation of said A/D converter circuit and said portable machine.

* * * * *